United States Patent
Sugiura et al.

(10) Patent No.: US 9,502,327 B2
(45) Date of Patent: Nov. 22, 2016

(54) SEMICONDUCTOR DEVICE AND METHOD FOR MANUFACTURING THE SAME

(71) Applicant: DENSO CORPORATION, Kariya, Aichi-pref. (JP)

(72) Inventors: Shun Sugiura, Kariya (JP); Yasushi Ookura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/913,719

(22) PCT Filed: Jan. 9, 2015

(86) PCT No.: PCT/JP2015/000072
§ 371 (c)(1),
(2) Date: Feb. 23, 2016

(87) PCT Pub. No.: WO2015/107879
PCT Pub. Date: Jul. 23, 2015

(65) Prior Publication Data
US 2016/0204047 A1    Jul. 14, 2016

(30) Foreign Application Priority Data

Jan. 20, 2014  (JP) ................. 2014-007530
Dec. 9, 2014   (JP) ................. 2014-249164

(51) Int. Cl.
*H01L 23/367* (2006.01)
*B23K 3/08* (2006.01)
(Continued)

(52) U.S. Cl.
CPC .......... *H01L 23/3675* (2013.01); *B23K 1/008* (2013.01); *B23K 1/0016* (2013.01);
(Continued)

(58) Field of Classification Search
None
See application file for complete search history.

(56) References Cited

U.S. PATENT DOCUMENTS

2005/0056927 A1    3/2005  Teshima et al.
2005/0077617 A1    4/2005  Hirano et al.
2016/0204047 A1*   7/2016  Sugiura ............... H01L 23/3675
                                                              257/712

FOREIGN PATENT DOCUMENTS

JP    2002-217364 A    8/2002
JP    2005-347684 A    12/2005
(Continued)

OTHER PUBLICATIONS

International Search Report of the International Searching Authority dated Apr. 7, 2015 issued in the corresponding International application No. PCT/JP2015/000072 (and English translation).
(Continued)

*Primary Examiner* — Jack Chen
(74) *Attorney, Agent, or Firm* — POSZ Law Group, PLC

(57) ABSTRACT

A semiconductor device includes: a semiconductor element having a solder region and a non-solder region on a first face; a first metal member disposed on the first face of the semiconductor element; a second metal member disposed on a rear face of the semiconductor element; a first solder that connects the solder region of the semiconductor element and the first metal member; and a second solder that connects the rear face of the semiconductor element and the second metal member. At least the second solder provides a melt-bond. A gravity center position of the first metal member coincides with a center position of the semiconductor element in a projection view from a stacking direction.

14 Claims, 13 Drawing Sheets

(51) Int. Cl.
*H01L 23/00* (2006.01)
*B23K 1/00* (2006.01)
*B23K 1/008* (2006.01)
*H01L 23/433* (2006.01)
*H01L 23/495* (2006.01)

(52) U.S. Cl.
CPC ........... *B23K 3/087* (2013.01); *H01L 23/4334* (2013.01); *H01L 23/49513* (2013.01); *H01L 23/49562* (2013.01); *H01L 23/49575* (2013.01); *H01L 24/33* (2013.01); *H01L 24/83* (2013.01); *B23K 2201/40* (2013.01); *H01L 2224/05554* (2013.01); *H01L 2224/32245* (2013.01); *H01L 2224/33181* (2013.01); *H01L 2224/48091* (2013.01); *H01L 2224/48247* (2013.01); *H01L 2224/48472* (2013.01); *H01L 2224/73265* (2013.01); *H01L 2224/83192* (2013.01); *H01L 2224/83201* (2013.01); *H01L 2224/83815* (2013.01); *H01L 2224/92247* (2013.01); *H01L 2924/13055* (2013.01); *H01L 2924/181* (2013.01)

(56) References Cited

FOREIGN PATENT DOCUMENTS

| | | |
|---|---|---|
| JP | 2008-135613 A | 6/2008 |
| JP | 2008-181908 A | 8/2008 |
| JP | 2012-186273 A | 9/2012 |

OTHER PUBLICATIONS

Written Opinion of the International Searching Authority dated Apr. 7, 2015 issued in the corresponding International application No. PCT/JP2015/000072 (and English translation).

* cited by examiner

SEMICONDUCTOR DEVICE AND METHOD FOR MANUFACTURING THE SAME

CROSS REFERENCE TO RELATED APPLICATIONS

This application is a U.S. national stage of International Application No. PCT/JP2015/000072 filed on Jan. 9, 2015 and is based on Japanese Patent Applications No. 2014-7530 filed on Jan. 20, 2014, and No. 2014-249164 filed on Dec. 9, 2014, the disclosures of which are incorporated herein by reference.

TECHNICAL FIELD

The present disclosure relates to a semiconductor device that includes a semiconductor element and metal members disposed on both sides of the semiconductor element, each of the metal members and the semiconductor element being electrically connected through solder, and a method for manufacturing the same.

BACKGROUND ART

Conventionally, there has been known a semiconductor device that includes a semiconductor element and metal members disposed on both sides of the semiconductor element, each of the metal members and the semiconductor element being electrically connected through solder as described in Patent Literature 1.

In Patent Literature 1, a heat sink block (hereinbelow, referred to as a first metal member) is disposed on a first face of the semiconductor element, and the semiconductor element and the first metal member are electrically connected through a first solder. A metal plate (hereinbelow, referred to as a second metal member) is disposed on a rear face of the semiconductor element, the rear face being located opposite to the first face, and the semiconductor element and the second metal member are electrically connected through a second solder.

As described in Patent Literature 1, the first face of the semiconductor element has a solder region which is a region connected to the first solder and a non-solder region which is not to be soldered. A plurality of control pads are disposed in the non-solder region. These control pads are disposed along one side in the first face having a rectangular plane shape. Accordingly, the center of the solder region is displaced from the center of the semiconductor element. Thus, the first metal member is disposed at a position displaced from the center of the semiconductor element. Thus, when the first solder and the second solder are reflowed with the semiconductor element stacked on the second metal member with the second solder interposed therebetween and the first metal member stacked on the semiconductor element with the first solder interposed therebetween, the semiconductor element is disadvantageously tilted. The tilt occurs not only when the reflow is performed. When at least the second solder, among the first solder and the second solder, is molten in the stacked state in forming the semiconductor device, the tilt occurs. In this manner, the tilt occurs during melt-joining.

When the semiconductor element is tilted in this manner, it is difficult to inspect each of the solders by using, for example, a scanning acoustic tomograph (SAT) after the formation of the semiconductor device. In the inspection using the SAT, for example, ultrasonic waves are transmitted from the first metal member in an inspection range from the first metal member to a predetermined depth in the stacking direction, and the reflected waves are received to inspect a connection state of the solder (for example, the presence or absence of a void). In this case, the first solder and the second solder are separately inspected. However, when the tilt occurs as described above, the first solder is present in the inspection range of the second solder in the stacking direction, and the connection state of the second solder cannot be evaluated. The same problem occurs in the evaluation of the connection state of the first solder. Further, it becomes difficult to connect bonding wires to the control pads.

PRIOR ART LITERATURES

Patent Literature

Patent Literature: JP-2008-135613-A

SUMMARY OF INVENTION

It is an object of the present disclosure to provide a semiconductor device reducing the tilt of a semiconductor element that occurs during melt-joining and a method for manufacturing the same.

According to a first aspect of the present disclosure, a semiconductor device includes: a semiconductor element having a first face and a rear face opposite to the first face, the first face including a solder region for soldering and a non-solder region not for soldering, the rear face being for soldering; a first metal member disposed on the first face of the semiconductor element; a second metal member disposed on the rear face of the semiconductor element; a first solder that connects the solder region of the semiconductor element and the first metal member; and a second solder that connects the rear face of the semiconductor element and the second metal member. At least the second solder provides a melt-bond in the semiconductor device, in which the semiconductor element is stacked on the second metal member through the second solder, and the first metal member is stacked on the semiconductor element through the first solder. A gravity center position of the first metal member coincides with a center position of the semiconductor element in a projection view from a stacking direction.

With this configuration, the gravity center position of the first metal member coincides with the center position of the semiconductor element in the projection view from the stacking direction. Thus, it is possible to reduce the tilt of the semiconductor element caused by the weight of the first metal member unevenly acting on the semiconductor element during melt-bond.

According to a second aspect of the present disclosure, a method for manufacturing the semiconductor device according to the first aspect, in which the first solder and the second solder provide reflow bonds as the melt-bond, the method for manufacturing the semiconductor device includes: preliminary applying the first solder onto the facing surface of the first metal member including the cut portion, the facing surface facing the semiconductor element, and preliminary applying the third solder onto the surface opposite to the facing surface so as to cover the cut portion; arranging the semiconductor element on the second metal member through the second solder, arranging the first metal member on the semiconductor element through the first solder, reflowing the first solder and the second solder in an arrangement of the semiconductor element and the first metal member, and forming a connection body having the second metal member, the semiconductor element, and the first metal member integrated together; and arranging the connection body on the third metal member through the third solder so as to face the third metal member, and reflowing the third solder while applying pressure from the second metal member.

With this configuration, the gravity center position of the first metal member coincides with the center position of the semiconductor element in the projection view from the stacking direction. Thus, it is possible to reduce the tilt of the semiconductor element caused by the weight of the first metal member unevenly acting on the semiconductor element during melt-bond.

According to a third aspect of the present disclosure, a method for manufacturing the semiconductor device according to the first aspect, in which the first solder and the second solder provide reflow bonds as the melt-bond, the method for manufacturing the semiconductor device includes: preliminary applying the first solder onto the facing surface of the first metal member including the cut portion, the facing surface facing the semiconductor element; arranging the semiconductor element on the second metal member through the second solder, arranging the first metal member on the semiconductor element through the first solder, reflowing the first solder and the second solder in an arrangement of the semiconductor element and the first metal member, and forming a connection body having the second metal member, the semiconductor element, and the first metal member integrated together; and arranging the third solder on the third metal member, arranging the connection body on the third metal member so as to face the third solder and the first metal member, and reflowing the third solder in an arrangement of the connection body while applying pressure from the second metal member With this configuration, the gravity center position of the first metal member coincides with the center position of the semiconductor element in the projection view from the stacking direction. Thus, it is possible to reduce the tilt of the semiconductor element caused by the weight of the first metal member unevenly acting on the semiconductor element during melt-bond.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Hereinbelow, embodiments of the present disclosure will be described with reference to the drawings. Identical reference signs designate common or related elements throughout the embodiments described below. A stacking direction of a semiconductor element, a terminal, and each heat sink (described below) is referred to as a Z direction. An extending direction, which is perpendicular to the Z direction, of a terminal section and a control terminal is referred to as a Y direction. A direction perpendicular to both the Z direction and the Y direction is referred to as an X direction. An XY plane defined by the X direction and the Y direction is a plane perpendicular to the Z direction. A shape along the XY plane is referred to as a plane shape unless otherwise specified.

First Embodiment

First, a schematic configuration of a semiconductor device will be described with reference to FIGS. 1 and 2. The semiconductor device is known as a so-called 1-in-1 package. For example, the semiconductor device is incorporated in an inverter circuit of a vehicle and applied as a device for PWM controlling a load.

Figure 1:
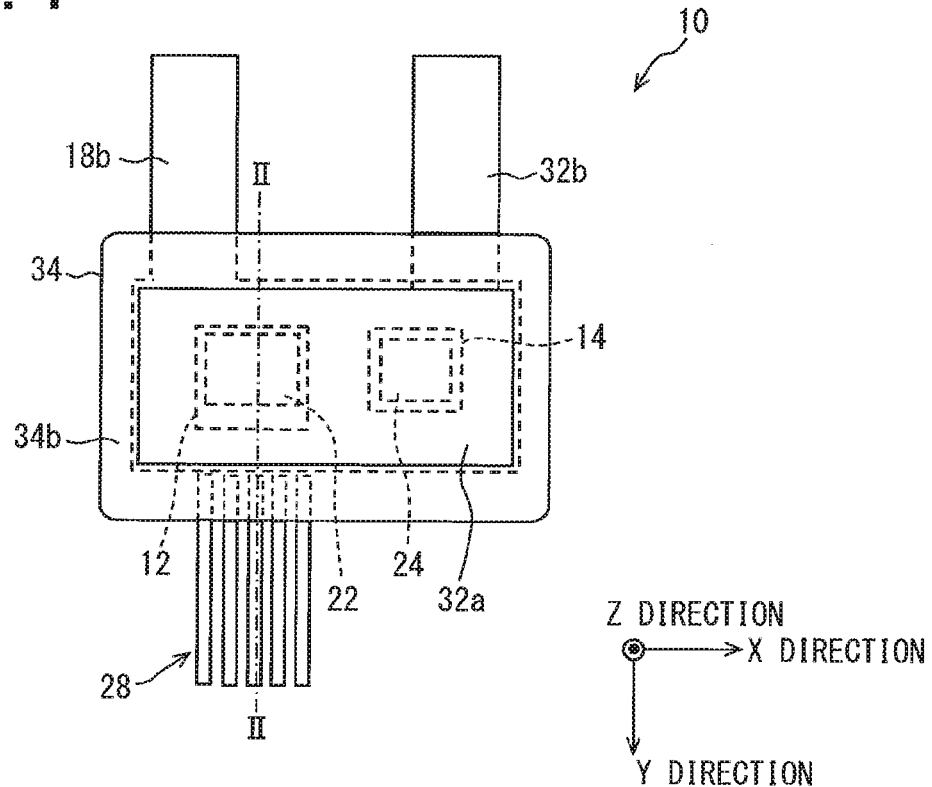
FIG. 1 is a plan view illustrating a schematic configuration of a semiconductor device according to a first embodiment.
Figure 2:
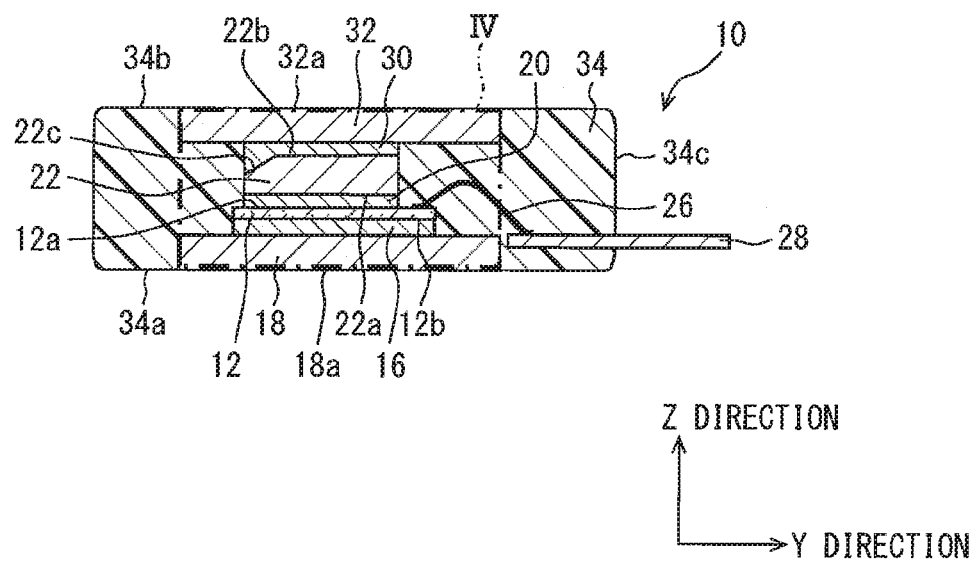
FIG. 2 is a sectional view taken along line II-II of FIG. 1.

As illustrated in FIG. 1, a semiconductor device 10 is provided with two semiconductor elements 12, 14. The semiconductor element 12 includes a semiconductor chip and an insulated gate bipolar transistor (IGBT) formed on the semiconductor chip. In the present embodiment, an N-channel IGBT is formed as an example. The semiconductor element 14 includes a semiconductor chip and a freewheeling diode (FWD) formed on the semiconductor chip. The freewheeling diode is also called a reflux diode. In the present embodiment, the semiconductor element 12 corresponds to a semiconductor element.

Each of the semiconductor elements 12, 14 has a so-called vertical structure so that current flows in the Z direction and has electrodes on both faces in the Z direction. The semiconductor element 12 includes an emitter electrode, a gate electrode, and control pads on a first face 12a which faces a terminal 22 and has a collector electrode on a rear face 12b which is located opposite to the first face 12a. On the other hand, the semiconductor element 14 includes an anode electrode at the same side as the first face 12a and has a cathode electrode at the same side as the rear face 12b.

These semiconductor elements 12, 14 are disposed side by side in the X direction and disposed at substantially the same position in the Z direction. The plane shape of each of the semiconductor elements 12, 14 is a substantially rectangular shape.

The collector electrode is formed on substantially the entire rear face 12b of the semiconductor element 12 and electrically, thermally, and mechanically connected to a first heat sink 18 through a solder 16. That is, the collector electrode of the semiconductor element 12 and the first heat sink 18 are joined together with the solder 16. In the same manner, the cathode electrode is also electrically, thermally, and mechanically connected to the first heat sink 18 through a solder (not illustrated). In the present embodiment, the solder 16 corresponds to a second solder, and the first heat sink 18 corresponds to a second metal member.

The first heat sink 18 has a function of dissipating heat generated by the semiconductor elements 12, 14 to the outside of the semiconductor device 10. In order to ensure thermal conductivity and electrical conductivity, the first heat sink 18 is formed of at least a metal material. For example, the first heat sink 18 is formed of a metal material having an excellent thermal conductivity and an excellent electrical conductivity such as copper, a copper alloy, and an aluminum alloy. In the surface of the first heat sink 18, a region in a facing face which faces the semiconductor elements 12, 14, the region having no solder 16, and a side face are covered with a sealing resin body 34 (described below). On the other hand, a face located opposite to the facing face constitutes a heat dissipation surface 18a which is exposed from a first face 34a of the sealing resin body 34.

The first heat sink 18 includes a terminal section 18b which serves as both a collector terminal of the IGBT of the semiconductor element 12 and a cathode terminal of the FWD of the semiconductor element 14. As illustrated in FIG. 1, the terminal section 18b extends in the Y direction. A part of the terminal section 18b projects to the outside from one side face 34c of the sealing resin body 34. In this manner, the terminal section 18b can be electrically connected to an external device.

The emitter electrode is formed on a part of the first face 12a of the semiconductor element 12 and electrically, thermally, and mechanically connected to the terminal 22 through a solder 20. That is, the emitter electrode of the semiconductor element 12 and the terminal 22 are joined together with the solder 20. In the same manner, an anode electrode of the semiconductor element 14 is also electrically, thermally, and mechanically connected to a terminal 24 indicated by a broken line in FIG. 1 through a solder (not illustrated). In the present embodiment, the solder 20 corresponds to a first solder, and the terminal 22 is connected to a first metal member.

Each of the terminals 22, 24 is located on the middle of a thermal and electrical conductive path between a second heat sink 32 (described below) and each of the semiconductor elements 12, 14. Thus, each of the terminals 22, 24 is formed using at least a metal member to ensure thermal conductivity and electrical conductivity. For example, each of the terminals 22, 24 is formed of a metal material having an excellent thermal conductivity and an excellent electrical conductivity such as copper and molybdenum.

Control pads are formed on the first face 12a of the semiconductor element 12 in a part of an outer peripheral region excepting a region in which the emitter electrode is formed. Control terminals 28 are electrically connected to the respective control pads through bonding wires 26. As illustrated in FIG. 1, the control terminals 28 extend in the Y direction. A part of each of the control terminals 28 extends to the outside from one side face 34c of the sealing resin body 34 at a side opposite to the side at which the terminal section 18b projects. In this manner, the control terminals 28 can be electrically connected to an external device.

The second heat sink 32 is electrically, thermally, and mechanically connected to a rear face 22b of the terminal 22, the rear face 22b being located opposite to a facing face 22a which faces the semiconductor element 12, through a solder 30. The terminal 24 corresponding to the semiconductor element 14 is also connected to the second heat sink 32 through a solder. The second heat sink 32 has a function of dissipating heat generated by the semiconductor elements 12, 14 to the outside of the semiconductor device 10 similarly to the first heat sink 18. In the present embodiment, the solder 30 corresponds to a third solder, and the second heat sink 32 corresponds to a third metal member.

The second heat sink 32 is formed using at least a metal material to ensure thermal conductivity and electrical conductivity similarly to the first heat sink 18. For example, the second heat sink 32 is formed of a metal material having an excellent thermal conductivity and an excellent electrical conductivity such as copper, a copper alloy, and an aluminum alloy. In the surface of the second heat sink 32, a region in a facing face which faces the terminals 22, 24, the region having no solder 30, and a side face are covered with the sealing resin body 34. On the other hand, a face opposite to the facing face constitutes a heat dissipation surface 32a which is exposed from a rear face 34b of the sealing resin body 34, the rear face 34b being located opposite to the first face 34a.

The second heat sink 32 includes a terminal section 32b which serves as both an emitter terminal of the semiconductor element 12 and an anode terminal of the semiconductor element 14. As illustrated in FIG. 1, the terminal section 32b extends in the Y direction at a position displaced from the control terminals 28 in the X direction. A part of the terminal section 32b projects to the outside from the side face 34c of the sealing resin body 34 at a side opposite to the side at which the control terminals 28 project. In this manner, the terminal section 32b can be electrically connected to an external device.

The semiconductor elements 12, 14, a part of the first heat sink 18, the terminals 22, 24, a part of each of the control terminals 28, the bonding wires 26, the solders 16, 20, 30, and a part of the second heat sink 32 are sealed with the sealing resin body 34. The sealing resin body 34 is molded by injecting a resin into a metal mold and has a substantially rectangular plane shape. For example, an epoxy resin may be employed as the resin.

As described above, the heat dissipation surface 18a of the first heat sink 18 is exposed from the first face 34a of the sealing resin body 34. The heat dissipation surface 18a is flush with the first face 34a. The heat dissipation surface 32a of the second heat sink 32 is exposed from the rear face 34b located opposite to the first face 34a. The heat dissipation surface 32a is flush with the rear face 34b. The control terminals 28 project from the side face 34c at one side. Each of the terminal sections 18b, 32b projects from the side face 34c at a side opposite to the side at which the control terminals 28 project.

Figure 3:
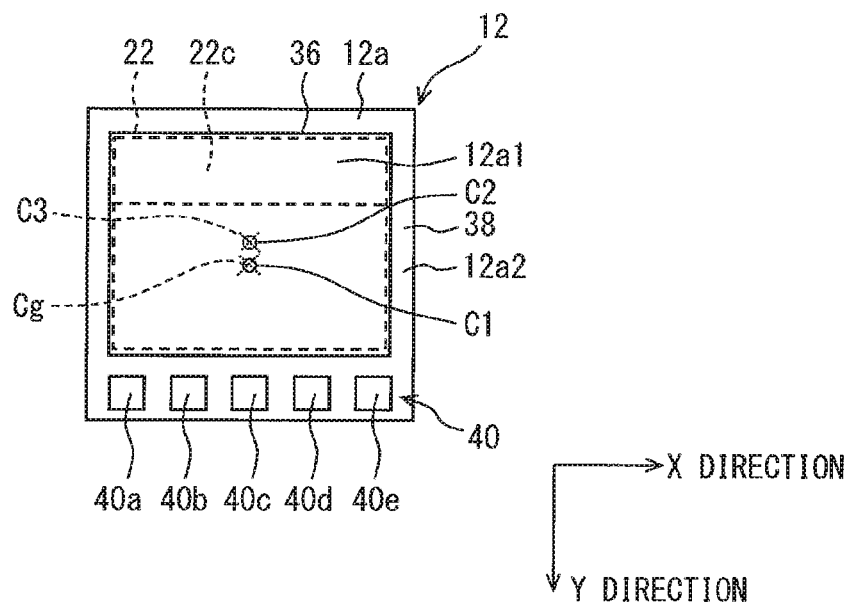
FIG. 3 is a plan view illustrating a schematic configuration of a semiconductor element.
Figure 4:
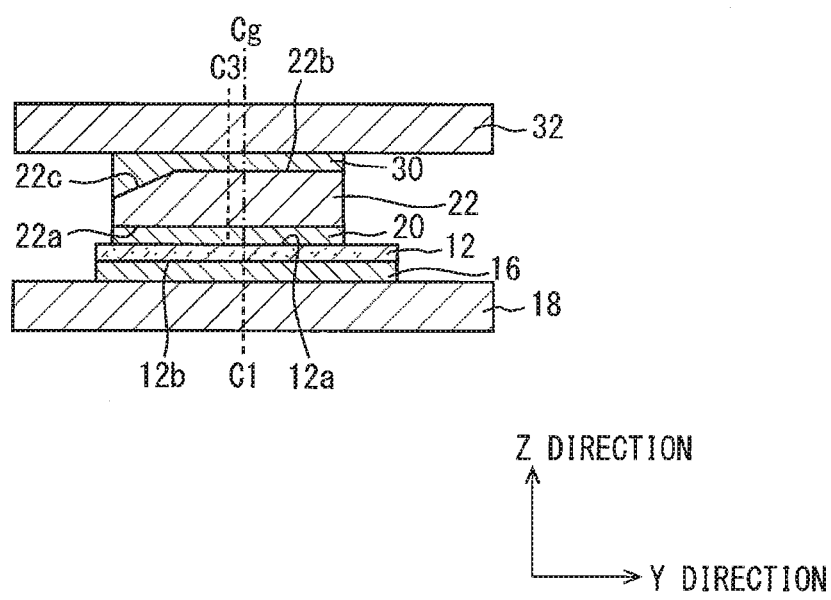
FIG. 4 is an enlarged view of a region IV illustrated in FIG. 2.

Next, the semiconductor element 12 and the terminal 22 will be described in detail with reference to FIGS. 3 and 4. In FIG. 4, the bonding wires 26 and the sealing resin body 34 are omitted for the sake of convenience.

The semiconductor element 12 includes the emitter electrode 36 on the first face 12a. The semiconductor element 12 also includes the control pads 40 in the outer peripheral region 38 which surrounds the emitter electrode 36. In the present embodiment, the emitter electrode 36 has a rectangular plane shape and includes an element center C1 which is the center of the semiconductor element 12 within the XY plane. In the first face 12a, substantially the entire emitter electrode 36 constitutes a solder region 12a1 which is connected to the terminal 22 through the solder 20. In the first face 12a, a region excepting the solder region 12a1 constitutes a non-solder region 12a2 which is not connected to the solder 20. That is, the non-solder region 12a2 includes at least the outer peripheral region 38. In the present embodiment, the control pads 40 correspond to external connection pads.

The control pads 40 include temperature sense pads 40a, 40b, a gate electrode pad 40c, a current sense pad 40d, and a Kelvin emitter pad 40e. These control pads 40 (40a to 40e) are formed side by side in the X direction in the outer peripheral region 38 at one end side in the Y direction. Thus, the outer peripheral region 38 is wider at the side having the control pads 40. Accordingly, a center C2 of the solder region 12a1 is displaced in the Y direction with respect to the element center C1.

The terminal 22 is formed by cutting away a part of a substantially rectangular parallelepiped. The facing face 22a of the terminal 22 is flat and has a rectangular plane shape which substantially coincides with the emitter electrode 36. That is, a terminal center C3 substantially coincides with the center C2 of the solder region 12a1 within the XY plane. The rear face 22b has the same rectangular plane shape as the facing face 22a. However, the rear face 22b is not flat in the entire area and has a cut portion 22c.

The cut portion 22c is a region located opposite to the control pads 40 in the Y direction and formed at a position away from the terminal center C3. The cut portion 22c is formed on the entire area in the X direction. A part of the rear face 22b in which the cut portion 22c is formed forms an inclined plane whose distance to the facing face 22a in the Z direction is reduced toward a direction away from the terminal center C3 in the Y direction. The remaining part of the rear face 22b forms a flat plane substantially parallel to the facing face 22a.

The cut portion 22c is formed so that a terminal gravity center Cg comes closer to the element center C1 of the semiconductor element 12 within the XY plane when the first heat sink 18, the semiconductor element 12, and the terminal 22 are connected through the solders 16, 20. Accordingly, the weight distribution of the terminal 22 is biased. In the present embodiment, the cut portion 22c is formed so that the terminal gravity center Cg coincides with the element center C1. In other words, the cut portion 22c is formed so that the terminal gravity center Cg coincides with the element center C1 in a projection view from the Z direction. The coincidence between the terminal gravity center Cg and the element center C1 is not limited to exact coincidence, and may be substantial coincidence. It is only required that the terminal gravity center Cg be located closer to the element center C1 than the terminal center C3.

The second heat sink 32 is substantially parallel to a flat part of the rear face 22b of the terminal 22 excepting the cut portion 22c. Thus, the solder 30 is thicker in a part corresponding to the cut portion 22c than a part corresponding to the flat part excepting the cut portion 22c.

The anode electrode is formed on substantially the entire first face of the semiconductor element 14. Thus, the terminal 24 has no cut portion and has a substantially rectangular parallelepiped shape.

Next, a method for manufacturing the semiconductor device 10 will be described with reference to FIGS. 5 to 10.

First, the semiconductor elements 12, 14, the heat sinks 18, 32, the terminals 22, 24, and the control terminals 28 are prepared. At this time, the terminal 22 having the cut portion 22c is prepared. The cut portion 22c may be formed, for example, when the terminal 22 is formed by punching out a metal plate.

Figure 5:
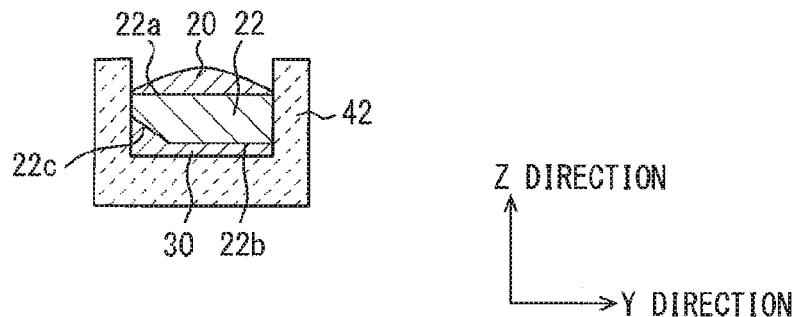
FIG. 5 is a sectional view illustrating a method for manufacturing the semiconductor device illustrated in FIG. 1.

Next, a preliminary soldering step is performed. In the preliminary soldering step, as illustrated in FIG. 5, the solder 30 is disposed inside a container 42 which is formed using, for example, carbon, and the terminal 22 is disposed on the solder 30 with the rear face 22b facing down. Then, the solder 20 is disposed so as to cover the terminal 22.

Accordingly, the solder 20 for preliminary soldering is applied to the facing face 22a of the terminal 22, and the solder 30 for preliminary soldering is applied to the rear face 22b so as to cover the cut portion 22c. The solders 20, 30 in a molten state may be disposed inside the container 42, or the solders 20, 30 may be molten after disposed inside the container 42. In the preliminary soldering step, preliminary soldering is applied also to both the faces of the terminal 24.

Figure 6:
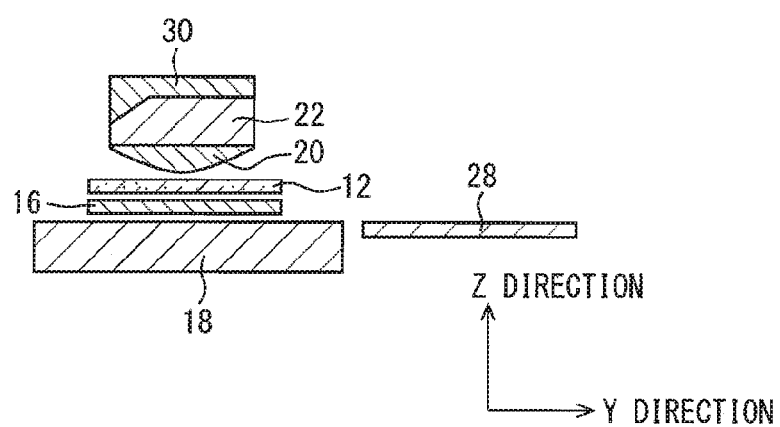
FIG. 6 is a sectional view illustrating the method for manufacturing the semiconductor device illustrated in FIG. 1.
Figure 7:
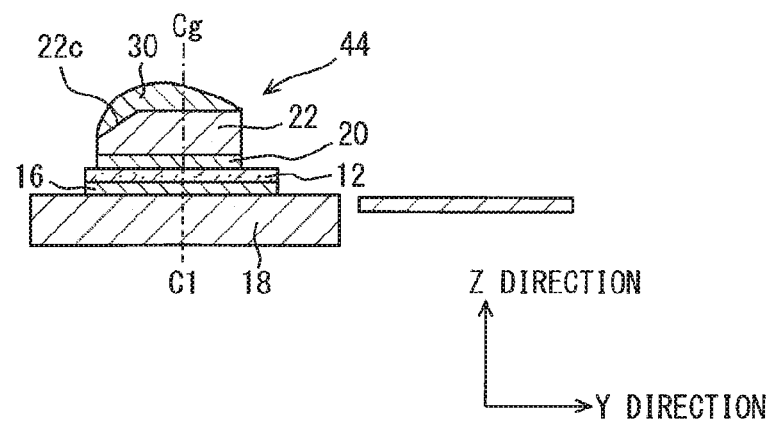
FIG. 7 is a sectional view illustrating the method for manufacturing the semiconductor device illustrated in FIG. 1.

Next, a first reflow step is performed. In the first reflow step, as illustrated in FIG. 6, the semiconductor element 12 is stacked on the first heat sink 18 with the solder 16 (for example, a solder foil) interposed therebetween, and the terminal 22 is stacked on the semiconductor element 12 with the solder 20 facing the semiconductor element 12. In this stacked state, the solders 16, 20, 30 are reflowed to form a connection body 44 which includes the first heat sink 18 the semiconductor element 12, and the terminal 22 integrated together as illustrated in FIG. 7. In this manner, the solders 16, 20 are simultaneously reflowed in the stacked state to join the semiconductor element 12 and the first heat sink 18 together with the molten solder 16 and to join the terminal 22 and the semiconductor element 12 together with the molten solder 20. That is, in the stacked state, the solders 16, 20 provide reflow joining as melt-joining.

In the present embodiment, the terminal 22 has the cut portion 22c, and the terminal 22 is disposed on the semiconductor element 12 in a manner to align the facing face 22a with the solder region 12a1. Accordingly, the terminal gravity center Cg substantially coincides with the element center C1 in the projection view from the Z direction. In this manner, the first reflow step is performed with the terminal gravity center Cg substantially coincident with the element center C1. In the first reflow step, a positioning jig may be used so as to align the facing face 22a with the solder region 12a1.

Since the second heat sink 32 as a connection target has not yet been connected to the solder 30, the solder 30 has a swollen shape with the apex corresponding to the center of the terminal 22 due to surface tension. In the first reflow step, the semiconductor element 14 is soldered to the first heat sink 18, and the terminal 24 is soldered to the semiconductor element 14.

Figure 8:
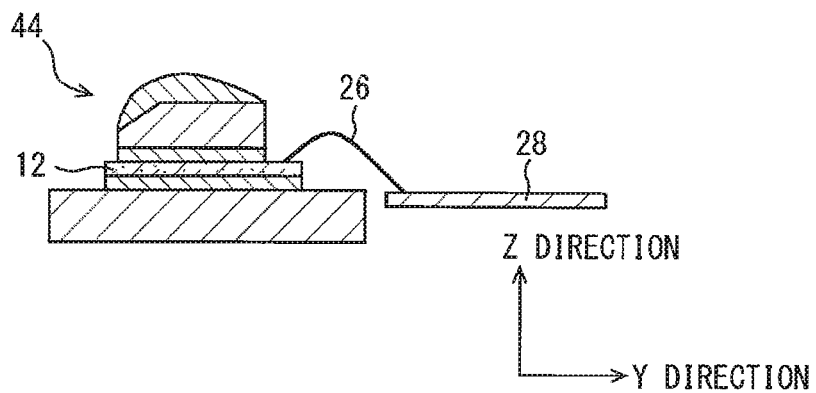
FIG. 8 is a sectional view illustrating the method for manufacturing the semiconductor device illustrated in FIG. 1.

Next, a wire bonding step is performed. In the wire bonding step, as illustrated in FIG. 8, the control terminals 28 are connected to the respective control pads 40 of the semiconductor element 12 with the bonding wires 26.

Figure 9:
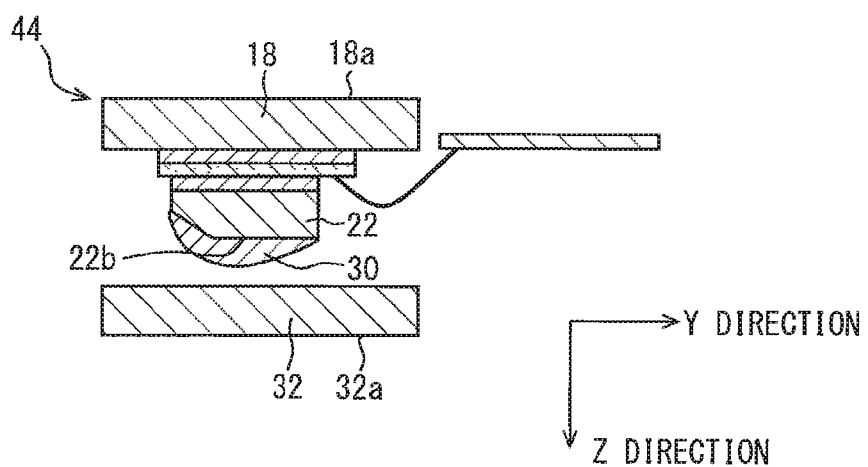
FIG. 9 is a sectional view illustrating the method for manufacturing the semiconductor device illustrated in FIG. 1.

Next, a second reflow step is performed. In the second reflow step, the second heat sink 32 is disposed on a mount (not illustrated). Then, as illustrated in FIG. 9, the connection body 44 is disposed on the second heat sink 32 with the solder 30 facing the second heat sink 32. Then, the solder 30 is reflowed while applying pressure from the first heat sink 18 in the Z direction. In the present embodiment, one end of a spacer (not illustrated) is fixed to the mount. The pressure is applied from the first heat sink 18 so as to bring the face of the first heat sink 18, the face being located opposite to the heat dissipation surface 18a, into contact with the other end of the spacer. That is, the spacer adjusts the distance between the heat dissipation surfaces 18a, 32a. Further, a heater disposed on the mount heats the second heat sink 32 to melt only the solder 30.

Figure 10:
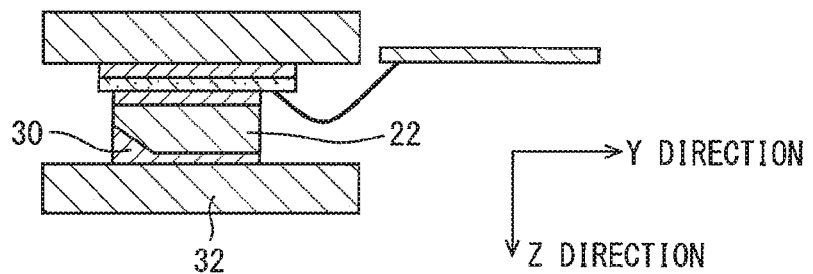
FIG. 10 is a sectional view illustrating the method for manufacturing the semiconductor device illustrated in FIG. 1.

Accordingly, as illustrated in FIG. 10, the second heat sink 32 and the terminal 22 are connected to each other through the solder 30. In the second reflow step, the terminal 24 and the second heat sink 32 are also connected to each other.

Next, a molding step of molding the sealing resin body 34 is performed. In the molding step, the connection structure obtained in the second reflow step is disposed in a metal mold (not illustrated), and a resin is injected into a cavity of the metal mold to mold the sealing resin body 34. In the present embodiment, the sealing resin body 34 is molded by a transfer mold method using an epoxy resin. Since the heat dissipation surface 18a of the heat sink 18 and the heat dissipation surface 32a of the heat sink 32 are cut in a cutting step (described below), the sealing resin body 34 is molded in such a manner that at least either the heat sink 18 or the heat sink 32 is not exposed from the sealing resin body 34.

Next, the cutting step is performed. In the cutting step, the first heat sink 18 is cut with a cutting tool (not illustrated) together with the sealing resin body 34 from the first face 34a of the sealing resin body 34. The cutting exposes only the heat dissipation surface 18a from the sealing resin body 34 in the first heat sink 18 and makes the heat dissipation surface 18a substantially flush with the first face 34a. Similarly, the second heat sink 32 is cut together with the sealing resin body 34 from the rear face 34b of the sealing resin body 34. The cutting exposes only the heat dissipation surface 32a from the sealing resin body 34 in the second heat sink 32 and makes the heat dissipation surface 32a flush with the rear face 34b. The cutting on both the faces makes it possible to ensure the flatness of the heat dissipation surfaces 18a, 32a and the parallelism between the heat dissipation surfaces 18a, 32a.

After the cutting step, a tie bar of a lead frame (not illustrated) is removed to obtain the semiconductor device 10. The removal of the unnecessary part may be performed before the cutting step.

Next, an effect of the semiconductor device 10 according to the present embodiment and the method for manufacturing the semiconductor device 10 will be described.

Figure 11:
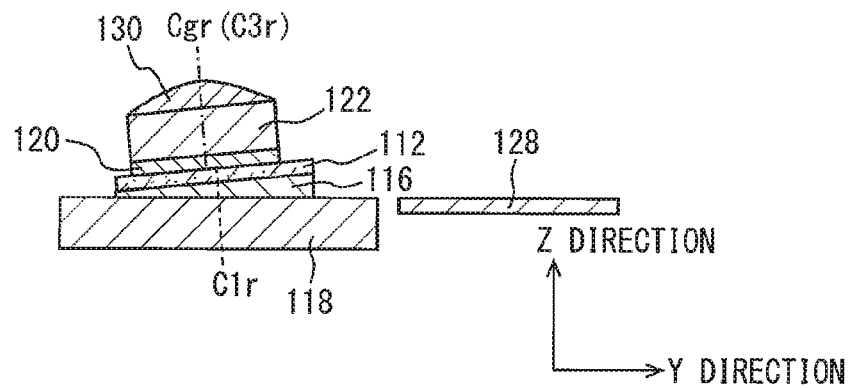
FIG. 11 is a diagram illustrating a reference example for describing the tilt of the semiconductor element.

As illustrated in FIG. 11 as a reference example, in a conventional semiconductor device, a terminal 122 has a substantially rectangular parallelepiped shape, and a terminal gravity center Cgr coincides with a terminal center C3r within the XY plane. That is, the terminal gravity center Cgr is displaced from an element center C1r in a projection view from the Z direction. Thus, when solders 116 and 120 are molten in the first reflow step, the weight of the terminal 122 acting on a semiconductor element 112 is larger at the terminal gravity center Cgr than the element center C1r in the Y direction, which causes the tilt of the semiconductor element 112. FIG. 11 illustrates a first heat sink 118, a control terminal 128, and a solder 130.

On the other hand, in the present embodiment, forming the cut portion 22c on the terminal 22 results in a partially different thickness of the terminal 22. Accordingly, the terminal gravity center Cg is located closer to the element center C1 than the terminal center C3 within the XY plane. Thus, it is possible to reduce the occurrence of the tilt of the semiconductor element 12 caused by the weight of the terminal 22 unevenly acting on the semiconductor element 12 in the first reflow step. Thus, it is possible to evaluate, for example, the presence or absence of a void for each of the solders 16, 20 located on both sides of the semiconductor element 12 by using, for example, a scanning acoustic tomograph (SAT).

In particular, in the present embodiment, the cut portion 22c is formed so that the terminal gravity center Cg coincides with the element center C1. Thus, the tilt of the semiconductor element 12 can be more effectively reduced.

As described above, the occurrence of the tilt of the semiconductor element 12 can be reduced in the present embodiment. Thus, in the wire bonding step after the first reflow step, the bonding wires 26 are easily ultrasonic-bonded to the control pads 40 of the semiconductor element 12.

The cut portion 22c can be formed, for example, simultaneously with the punching-out of the terminal 22. Thus, the configuration of the terminal 22 can be simplified.

In the present embodiment, the cut portion 22c is formed on the rear face 22b of the terminal 22. Accordingly, the thickness of the solder 20 between the semiconductor element 12 and the terminal 22 is substantially uniform. Thus, it is possible to further improve the heat dissipation from the semiconductor element 12 to the second heat sink 32 compared with a configuration that has a cut portion formed on the facing face 22a located close to the semiconductor element 12, that is, close to a heat generation source.

The configuration that achieves the partially different thickness of the terminal 22 is not limited to the cut portion 22c. In a first modification illustrated in FIG. 12, a cut portion 22c is formed as a V-shaped groove. Such a cut portion 22c can be formed by striking the terminal 22 from the rear face 22b.

Figure 13:
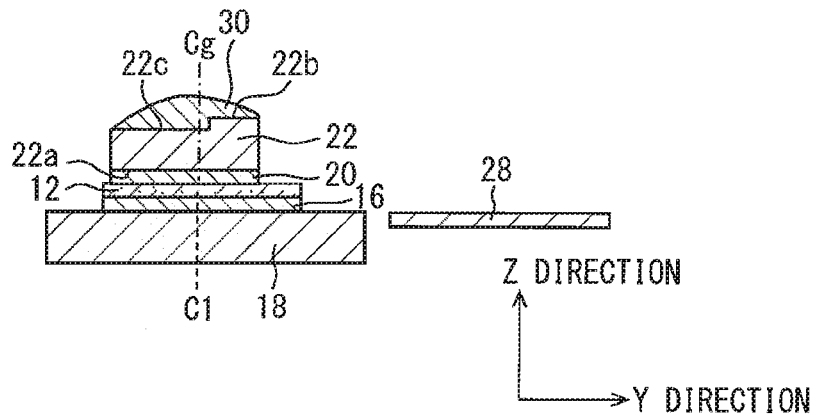
FIG. 13 is a sectional view illustrating a second modification and corresponds to FIG. 7.

In a second modification illustrated in FIG. 13, a part of the rear face 12b within a predetermined range is uniformly recessed by a predetermined depth in the Z direction to form a cut portion 22c. In FIG. 13, the cut portion 22c is formed from an end opposite to the control pads 40 across the terminal gravity center Cg. On the other hand, in a third modification illustrated in FIG. 14, the entire rear face 22b forms an inclined plane. Accordingly, the terminal 22 has a partially different thickness. Specifically, the terminal 22 becomes thicker toward the control pads 40 in the Y direction.

Figure 14:
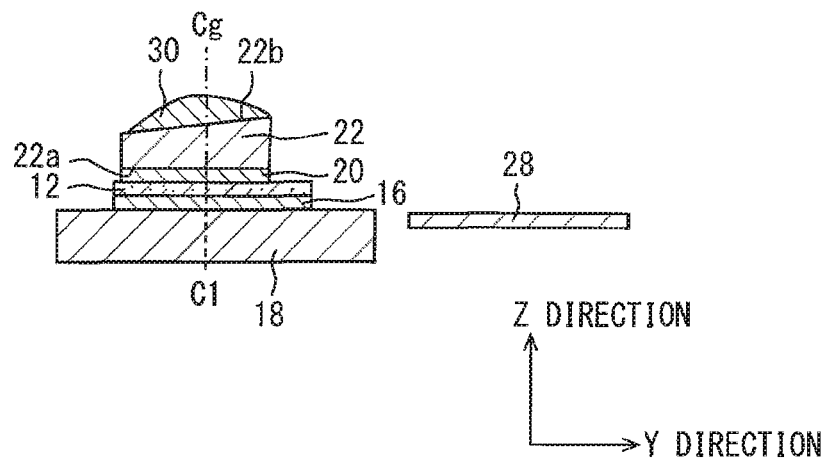
FIG. 14 is a sectional view illustrating a third modification and corresponds to FIG. 7.

In FIG. 13, a flat part excepting the cut portion 22c is narrower than the cut portion 22c. In FIG. 14, the entire rear face 22b forms the inclined plane. For example, when the solders 16, 20 are molten together with the solder 30 in the second reflow step, forming not a little flat part on the rear face 22b as illustrated in FIG. 13 makes it possible to reduce the tilt of the terminal 22 with respect to the XY plane and, in addition, the tilt of the semiconductor element 12 caused by the tilt of the terminal 22. Thus, it is possible to evaluate the presence or absence of a void for each of the solders 16, 20 located on both the sides of the semiconductor element 12. Preferably, the flat part excepting the cut portion 22c may be wider than the cut portion 22c. This improves an effect of reducing the tilt when the solders 16, 20 are also molten in the second reflow step. As described above, when only the solder 30 is molten in the second reflow step, the tilt of the terminal 22 can be reduced regardless of the presence or absence of the flat part of the terminal 22.

Figure 12:
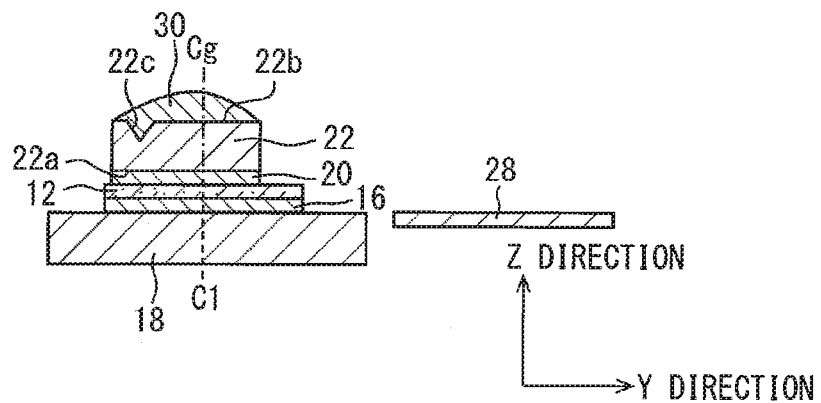
FIG. 12 is a sectional view illustrating a first modification and corresponds to FIG. 7.

Since the terminals 22 illustrated in FIGS. 4 and 12 can be formed by punching-out or striking, the manufacture of the terminals 22 illustrated in FIGS. 4 and 12 is easier than the manufacture of the terminals 22 illustrated in FIGS. 13 and 14.

Second Embodiment

In the present embodiment, description of a common part with the semiconductor device 10 and the method for manufacturing the semiconductor device 10 described in the first embodiment is omitted.

In the first embodiment, there has been described an example in which the solders 20, 30 for preliminary soldering are applied to both the faces 22a, 22b of the terminal 22 in the preliminary soldering step. In this case, the solder 30 for preliminary soldering is applied so as to cover the cut portion 22c. The metal material constituting the terminal 22 (for example, copper) has a larger specific gravity than the solder 30. Thus, even when the solder 30 is applied so as to cover the cut portion 22c, the terminal gravity center Cg comes closer to the element center C1 than the terminal center C3 within the XY plane. However, the effect is reduced by the solder 30.

Figure 15:
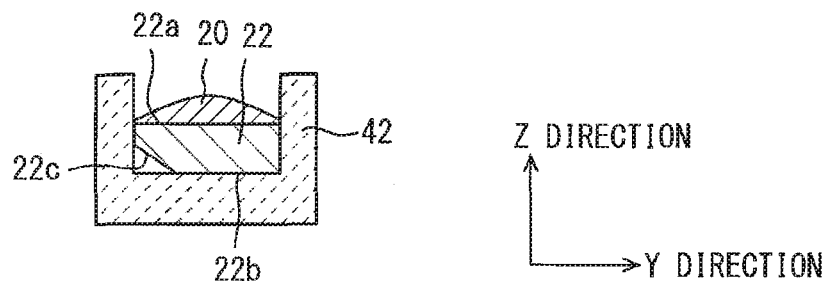
FIG. 15 is a sectional view illustrating a method for manufacturing a semiconductor device according to a second embodiment.

In view of the above, in the present embodiment, only a solder 20 for preliminary soldering is applied to a terminal 22 in a preliminary soldering step as illustrated in FIG. 15. That is, no solder 30 for preliminary soldering is applied to the rear face 22b.

Figure 16:
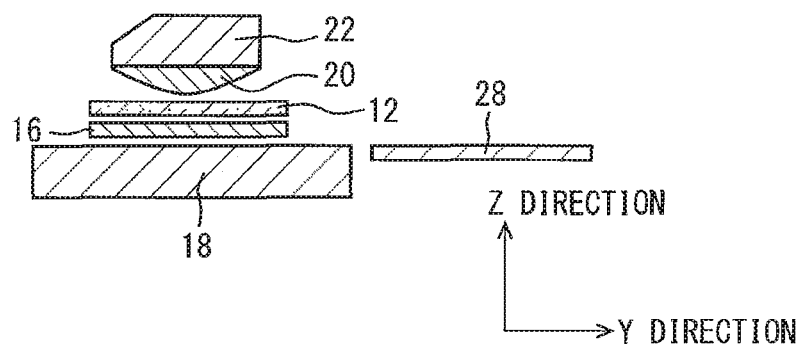
FIG. 16 is a sectional view illustrating the method for manufacturing the semiconductor device according to the second embodiment.
Figure 17:
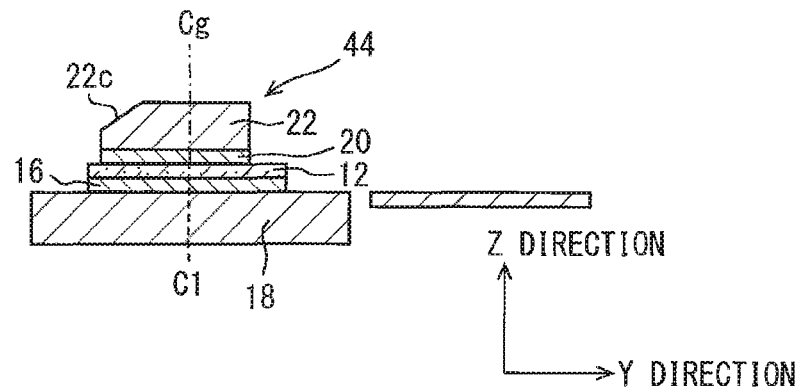
FIG. 17 is a sectional view illustrating the method for manufacturing the semiconductor device according to the second embodiment.

In a first reflow step, as illustrated in FIG. 16, a semiconductor element 12 is stacked on a first heat sink 18 with a solder 16 interposed therebetween. Further, the terminal 22 with only the solder 20 applied thereto is stacked on the semiconductor element 12 with the solder 20 facing the semiconductor element 12. In the stacked state, the solders 16, 20 are reflowed to form a connection body 44 which includes the first heat sink 18, the semiconductor element 12, and the terminal 22 integrated together as illustrated in FIG. 17. In the present embodiment, no solder 30 is applied to the terminal 22. Thus, not only a terminal gravity center Cg, but also the gravity center of the terminal 22 including the solder 20 substantially coincides with an element center C1 in a projection view from the Z direction.

Figure 18:
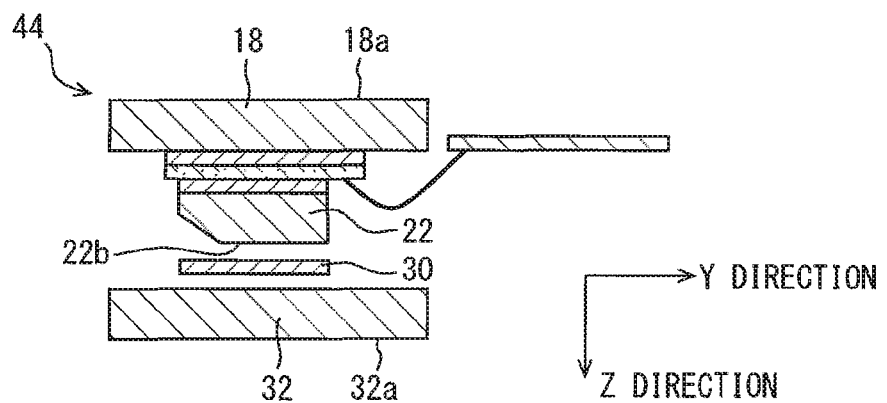
FIG. 18 is a sectional view illustrating the method for manufacturing the semiconductor device according to the second embodiment.

A wire bonding step and a second reflow step are sequentially performed after the first reflow step similarly to the first embodiment. In the second reflow step, a second heat sink 32 is disposed on a mount (not illustrated). Then, as illustrated in FIG. 18, a solder 30 (for example, a solder foil) and the connection body 44 are disposed in this order on the second heat sink 32. Then, the solder 30 is reflowed while applying pressure from the first heat sink 18 in the Z direction.

A molding step and a cutting step are performed after the second reflow step similarly to the first embodiment. Accordingly, the semiconductor device 10 described in the first embodiment can be obtained.

Next, an effect of a semiconductor device 10 according to the present embodiment will be described.

In the present embodiment, only the solder 20 for preliminary soldering is applied to the terminal 22 in the preliminary soldering step. Thus, not only the terminal gravity center Cg, but also the gravity center of the terminal 22 including the solder 20 substantially coincides with the element center C1 in the projection view from the Z direction in the first reflow. Thus, it is possible to further improve the effect of reducing the tilt of the semiconductor element 12 obtained by forming the cut portion 22c compared with the method in which the solder 30 for preliminary soldering is applied so as to cover the cut portion 22c in the preliminary soldering step.

Third Embodiment

In the present embodiment, description of a common part with the semiconductor device 10 and the method for manufacturing the semiconductor device 10 described in the first embodiment is omitted.

Figure 19:
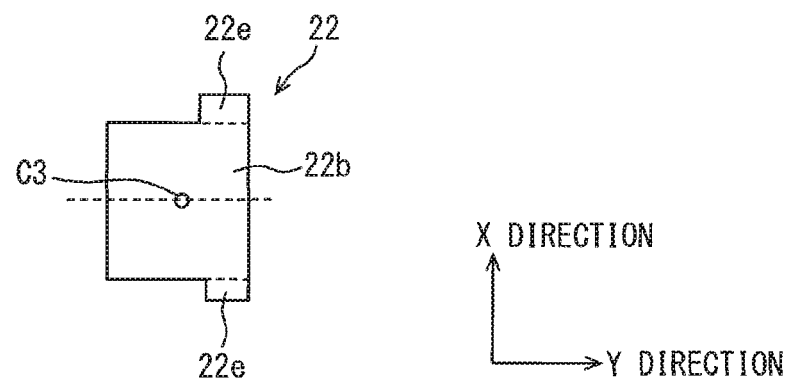
FIG. 19 is a plan view illustrating a schematic configuration of a terminal in a semiconductor device according to a third embodiment.
Figure 20:
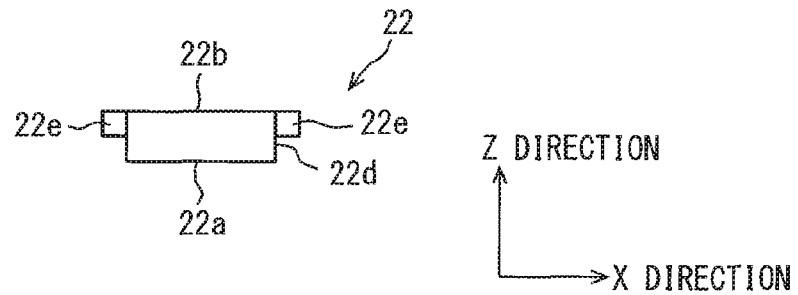
FIG. 20 is a side view illustrating the schematic configuration of the terminal.

In the first embodiment, there has been described an example in which the cut portion 22c is formed on the rear face 22b of the terminal 22 to achieve the partially different thickness of the terminal 22. On the other hand, in the present embodiment, a terminal 22 has projections 22e which project from side faces 22d adjacent to both a facing face 22a and a rear face 22b as illustrated in FIGS. 19 and 20. Each of the projections 2e is formed on the corresponding side face 22d at a position away from the facing face 22a in the Z direction. In the side faces 22d located opposite to each other, the projections 22e are formed in regions between a terminal center C3 and the control pads 40. The terminal 22 is line-symmetric with respect to a virtual line that passes through the terminal center C3 along the Y direction. The projections 22e are flush with the rear face 22b.

Next, an effect of a semiconductor device 10 according to the present embodiment will be described.

The present embodiment makes it possible to reduce the occurrence of the tilt of the semiconductor element 12 in the first reflow step similarly to the first embodiment.

Figure 21:
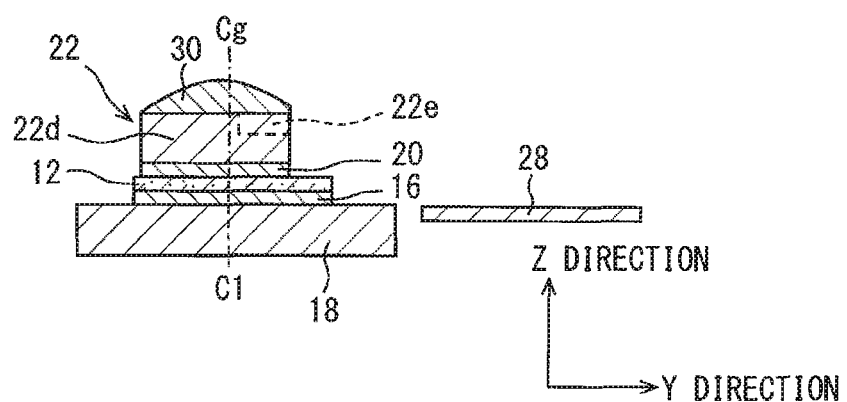
FIG. 21 is a sectional view illustrating an effect of the semiconductor device according to the third embodiment and corresponds to FIG. 7.

As illustrated in FIG. 21, the projections 22e which project from the side faces 22d are formed on the terminal 22 to achieve a partially different thickness of the terminal 22 to bring a terminal gravity center Cg close to the element center C1 in a projection view from the Z direction. Further, the terminal gravity center Cg is brought into coincidence with the element center C1. Thus, it is possible to make both the facing face 22a and the rear face 22b flat. That is, the thickness of each of the solders 20, 30 can be made substantially uniform within the XY plane. Accordingly, it is possible to improve the heat dissipation from the semiconductor element 12 to the second heat sink 32.

Further, both the facing face 22a and the rear face 22b are flat. Thus, even when the solders 16, 20 are molten together with the solder 30 in the second reflow step, it is possible to reduce the tilt of the terminal 22 with respect to the XY plane and, in addition, the tilt of the semiconductor element 12 caused by the tilt of the terminal 22.

Since the projections 22e are formed at the positions away from the facing face 22a, it is possible to reduce adhesion of the solder 20 to the projections 22e. Accordingly, the solder 20 is connected to the terminal 22 only on the facing face 22a, which enables the heat dissipation to be improved.

Fourth Embodiment

In the present embodiment, description of a common part with the semiconductor device 10 and the method for manufacturing the semiconductor device 10 described in the first embodiment is omitted.

Figure 22:
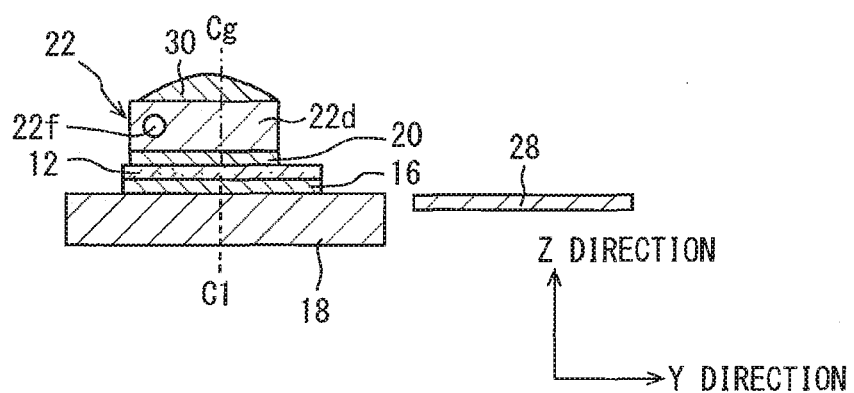
FIG. 22 is a sectional view illustrating an effect of a semiconductor device according to a fourth embodiment and corresponds to FIG. 7.

In the present embodiment, a terminal 22 has a cavity 22f which is open on side faces 22d as illustrated in FIG. 22. Specifically, the cavity 22f is formed in a region located opposite to the control pads 40 with respect to a terminal center C3 and penetrates the opposite side faces 22d. The cavity 22f may be formed by machining such as drilling.

Next, an effect of a semiconductor device 10 according to the present embodiment will be described.

In the present embodiment, the cavity 22f which is open on the side faces 22d is formed on the terminal 22 to achieve a partially different thickness of the terminal 22 to bring a terminal gravity center Cg close to the element center C1 in a projection view from the Z direction. Further, the terminal gravity center Cg is brought into coincidence with the element center C1. Thus, it is possible to reduce the occurrence of the tilt of the semiconductor element 12 in the first reflow step similarly to the first embodiment.

Further, forming the cavity 22f makes both a facing face 22a and a rear face 22b flat. Thus, even when the solders 16, 20 are molten in the second reflow step similarly to the third embodiment, it is possible to reduce the tilt of the terminal 22 with respect to the XY plane and, in addition, the tilt of the semiconductor element 12 caused by the tilt of the terminal 22.

Figure 23:
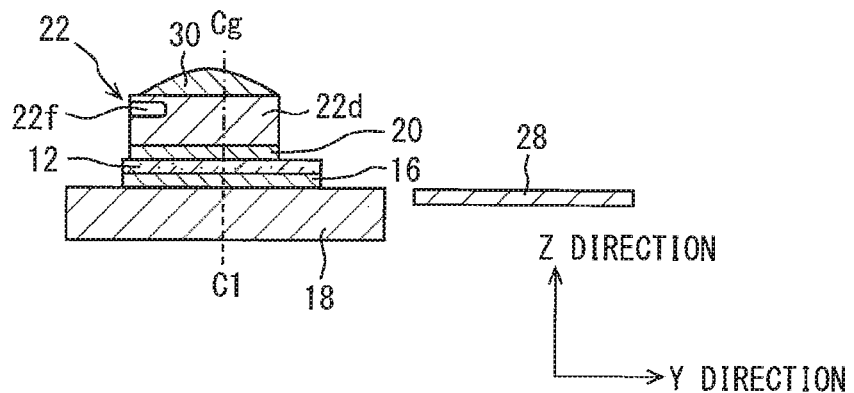
FIG. 23 is a sectional view illustrating a fourth modification and corresponds to FIG. 7.

The cavity 22f is not limited to the above example. In a fourth modification illustrated in FIG. 23, a cavity 22f is a groove which is formed across three adjacent side faces 22d.

Fifth Embodiment

In the present embodiment, description of a common part with the semiconductor device 10 and the method for manufacturing the semiconductor device 10 described in the first embodiment is omitted.

Figure 24:
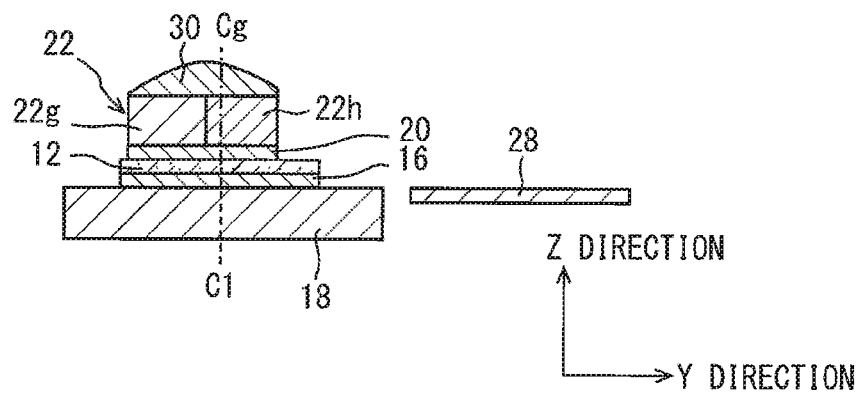
FIG. 24 is a sectional view illustrating an effect of a semiconductor device according to a fifth embodiment and corresponds to FIG. 7.

In the present embodiment, the material constituting a terminal 22 has a partially different density within the XY plane. In an example illustrated in FIG. 24, the terminal 22 has a low density part 22g which is a base material itself of the terminal 22 and a high density part 22h which is formed by mixing a material having a higher density than the base material with the base material. In the Y direction, a half of the terminal 22 located at a side corresponding to the control pads 40 constitutes the high density part 22h, and the other half thereof constitutes the low density part 22g.

Next, an effect of a semiconductor device 10 according to the present embodiment will be described.

In the present embodiment, the terminal 22 has the partially different density to bring a terminal gravity center Cg close to the element center C1 in a projection view from the Z direction. Further, the terminal gravity center Cg is brought into coincidence with the element center C1. Thus, it is possible to reduce the occurrence of the tilt of the semiconductor element 12 in the first reflow step similarly to the first embodiment.

Further, both a facing face 22a and a rear face 22b are flat. Thus, it is possible to improve the heat dissipation from the semiconductor element 12 to the second heat sink 32 similarly to the third embodiment. Further, even when the solders 16, 20 are molten in the second reflow step, it is possible to reduce the tilt of the terminal 22 with respect to the XY plane and, in addition, the tilt of the semiconductor element 12 caused by the tilt of the terminal 22.

Figure 25:
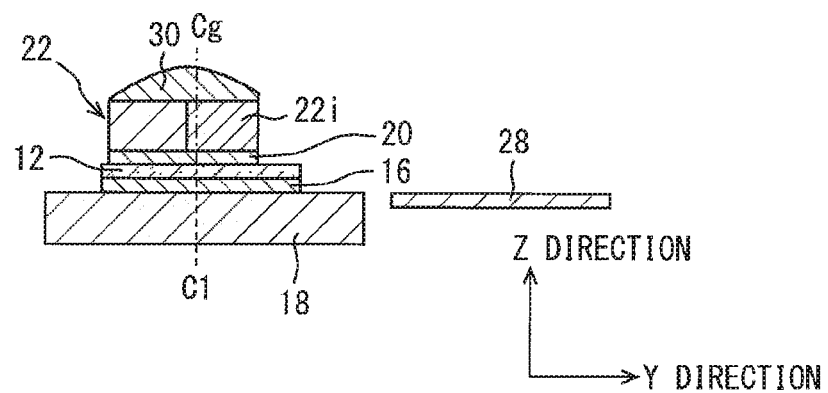
FIG. 25 is a sectional view illustrating a fifth modification and corresponds to FIG. 7.

A method for achieving the difference in density is not limited to the above example. In a fifth modification illustrated in FIG. 25, a plating 22i is applied to a part of the surface of the terminal 22 at a side corresponding to the control pads 40. A material having a higher density than the material of the terminal 22 may be used as the plating 22i. Accordingly, it is possible to make the part with the plating 22i heavier than a part without the plating 22i. As a result, it is possible to bring the terminal gravity center Cg close to the element center C1 in a projection view from the Z direction and, further, bring the terminal gravity center Cg into coincidence with the element center C1.

Alternatively, the surface of the low density part 22g and the surface of the high density part 22h may be plated, and a plating material on the high density part 22h may have a higher density than a plating material on the low density part 22g.

Sixth Embodiment

In the present embodiment, description of a common part with the semiconductor device 10 and the method for manufacturing the semiconductor device 10 described in the first embodiment is omitted.

In the first embodiment, there has been described an example in which the terminal 22 includes a single member.

Figure 26:
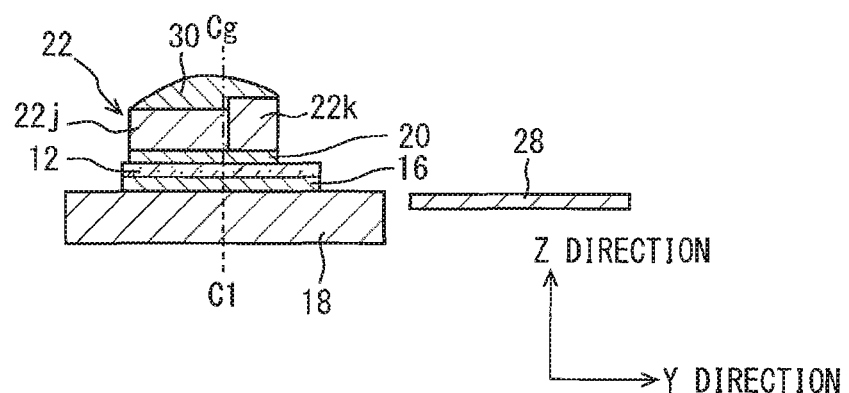
FIG. 26 is a sectional view illustrating an effect of a semiconductor device according to a sixth embodiment and corresponds to FIG. 7.

On the other hand, in the present embodiment, a terminal 22 includes a plurality of members. In an example illustrated in FIG. 26, the terminal 22 includes two members 22j, 22k. Both the first member 22j and the second member 22k are formed using the same material and integrated together by joining. The second member 22k which is located at a side corresponding to the control pads 40 in the Y direction is higher than the first member 22j in the Z direction.

Next, an effect of a semiconductor device 10 according to the present embodiment will be described.

In the present embodiment, the terminal 22 includes the plurality of members 22j, 22k, and the members 22j, 22k differ in height to bring a terminal gravity center Cg close to the element center C1 in a projection view from the Z direction. Further, the terminal gravity center Cg is brought into coincidence with the element center C1. This configuration also makes it possible to achieve an effect similar to the effect of the first embodiment.

Figure 27:
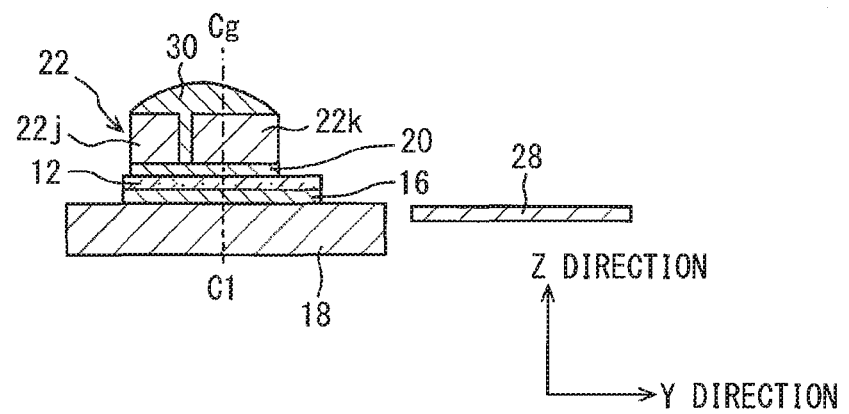
FIG. 27 is a sectional view illustrating a sixth modification and corresponds to FIG. 7.

The configuration including a plurality of members is not limited to the above example. As described in the fifth embodiment, the constituent material of the first member 22j and the constituent material of the second member 22k may differ in density. Alternatively, the surface of the second member 22k may be plated. Alternatively, as in a sixth modification illustrated in FIG. 27, a first member 22j and a second member 22k which constitute a terminal 22 may be separated from each other.

Seventh Embodiment

In the present embodiment, description of a common part with the semiconductor device 10 and the method for manufacturing the semiconductor device 10 described in the first embodiment is omitted.

Figure 28:
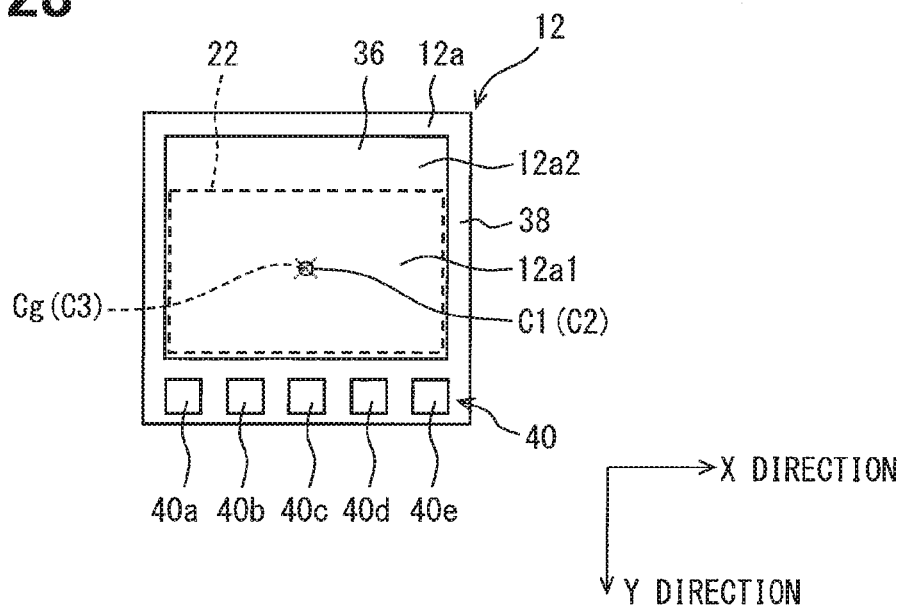
FIG. 28 is a plan view illustrating a schematic configuration of a semiconductor element in a semiconductor device according to a seventh embodiment and corresponds to FIG. 3.

In the first embodiment, there has been described an example in which the cut portion 22c is formed on the terminal 22 to bring the terminal gravity center Cg into coincidence with the element center C1 in the projection view from the 1 direction. On the other hand, in the present embodiment, a solder region 12a1 and non-solder regions 12a2 of a semiconductor element 12 are divided so that a center C2 of the solder region 12a1 coincides with an element center C1 within the XY plane as illustrated in FIG. 28. That is, adjustment is performed on the semiconductor element 12 so that the terminal gravity center Cg coincides with the element center C1.

In FIG. 28, the arrangement of an emitter electrode 36 and an outer peripheral region 38 is the same as that in the first embodiment. The seventh embodiment differs from the first embodiment in that not the entire emitter electrode 36, but only a part of the emitter electrode 36 located closer to the control pads 40 in the Y direction is defined as the solder region 12a1 indicated by a broken line which is soldered to the terminal 22. Thus, in the emitter electrode 36, the vicinity of an end located opposite to the control pads 40 in the Y direction constitutes the non-solder region 12a2. Accordingly, the non-solder regions 12a2 are formed with the solder region 12a1 interposed therebetween in the Y direction. The non-solder regions 12a2 on both sides have substantially the same length in the Y direction.

Next, an effect of a semiconductor device 10 according to the present embodiment will be described.

Figure 29:
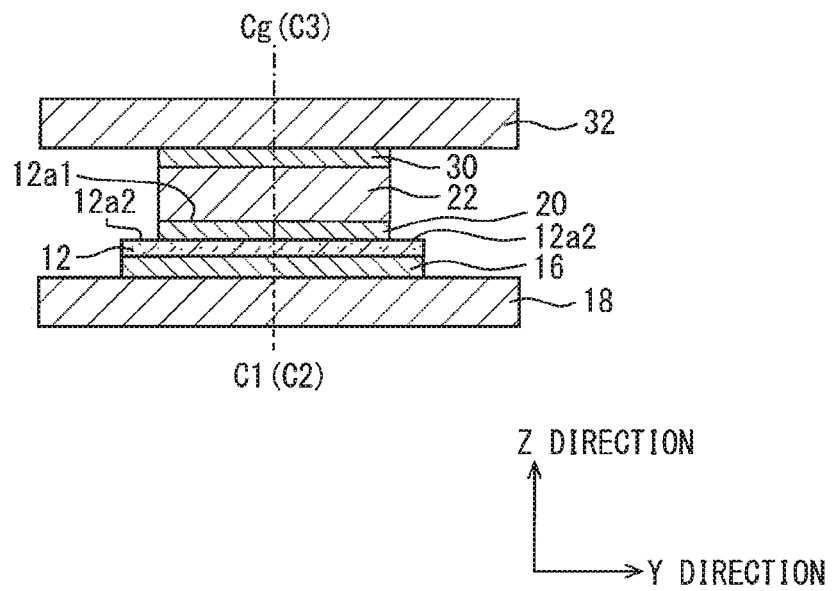
FIG. 29 is a sectional view illustrating an effect of the semiconductor device and corresponds to FIG. 4.

In the present embodiment, in the semiconductor element 12, the part of the emitter electrode 36 located opposite to the control pads 40 is defined as the non-solder region 12a2. Accordingly, as illustrated in FIG. 29, the center C2 of the solder region 12a1 is brought into coincidence with the element center C1 and, further, coincidence with the terminal gravity center Cg in a projection view from the Z direction. The terminal 22 has a substantially rectangular parallelepiped shape, and the terminal center C3 coincides with the terminal gravity center Cg. This configuration also makes it possible to achieve an effect similar to the effect of the first embodiment. FIG. 29 corresponds to FIG. 4 and omits the sealing resin body 34 and the bonding wires 26 similarly to FIG. 4.

Eighth Embodiment

In the present embodiment, description of a common part with the semiconductor device 10 and the method for manufacturing the semiconductor device 10 described in the seventh embodiment is omitted.

Figure 30:
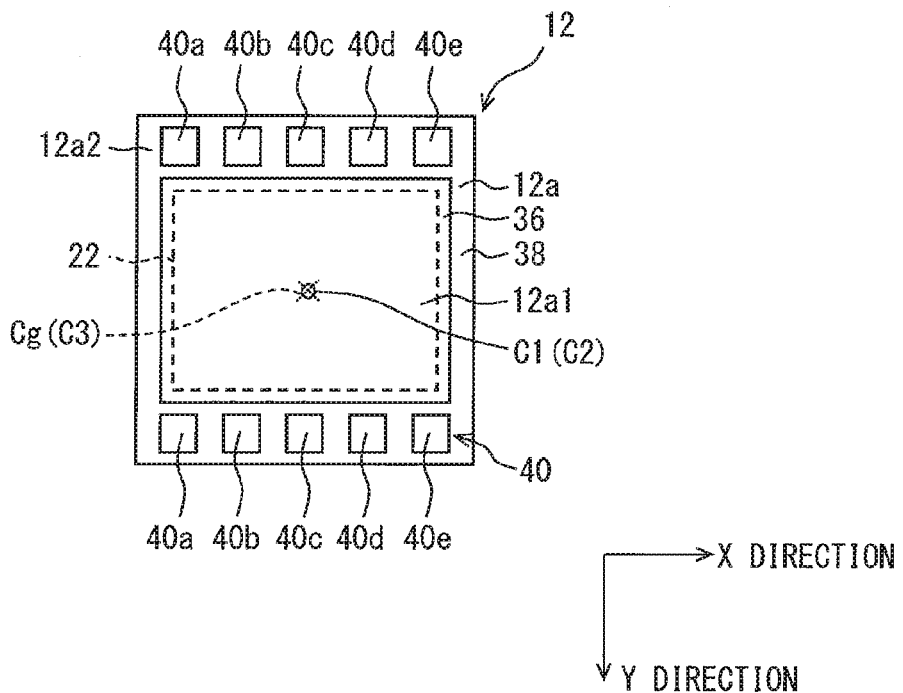
FIG. 30 is a plan view illustrating a schematic configuration of a semiconductor element in a semiconductor device according to an eighth embodiment and corresponds to FIG. 3.

In the seventh embodiment, there has been described an example in which the control pads 40 are disposed in one of the non-solder regions 12a2 which are formed with the solder region 12a1 interposed therebetween in the Y direction. On the other hand, in the present embodiment, the same kinds and same number of control pads 40 are disposed on non-solder regions 12a2 (outer peripheral region 38) located on both sides in the Y directions as illustrated in FIG. 30. The control pads 40 in each of the non-solder regions 12a2 are formed in the same order in the X direction. In the present embodiment, the Y direction corresponds to a first direction, and the X direction corresponds to a second direction.

Specifically, in the Y direction, one of the non-solder regions 12a2 is located on one end side of the solder region 12a1, and the other non-solder region 12a2 is located on the other end side of the solder region 12a1. The plurality of kinds of control pads 40 are disposed in the non-solder region 12a2 on one end side. The same kinds and same number of control pads 40 as the control pads 40 in the non-solder region 12a2 on one end side are disposed in the non-solder region 12a2 on the other end side. In the non-solder region 12a2 on one end side, the plurality of kinds of control pads 40 are formed in a predetermined order along the X direction. In the non-solder region 12a2 on the other end side, the control pads 40 are formed in the same order as the control pads 40 formed in the non-solder region 12a2 on one end side along the X direction. In the present embodiment, a temperature sense pad 40a (cathode), a temperature sense pad 40b (anode), a gate electrode pad 40c, a current sense pad 40d, and a Kelvin emitter pad 40e are formed as the control pads 40 in each of the non-solder regions 12a2 on one and the other end sides. The temperature sense pad 40a, the temperature sense pad 40b, the gate electrode pad 40c, the current sense pad 40d, and the Kelvin emitter pad 40e are formed in this order from the left side of the drawing.

Figure 31:
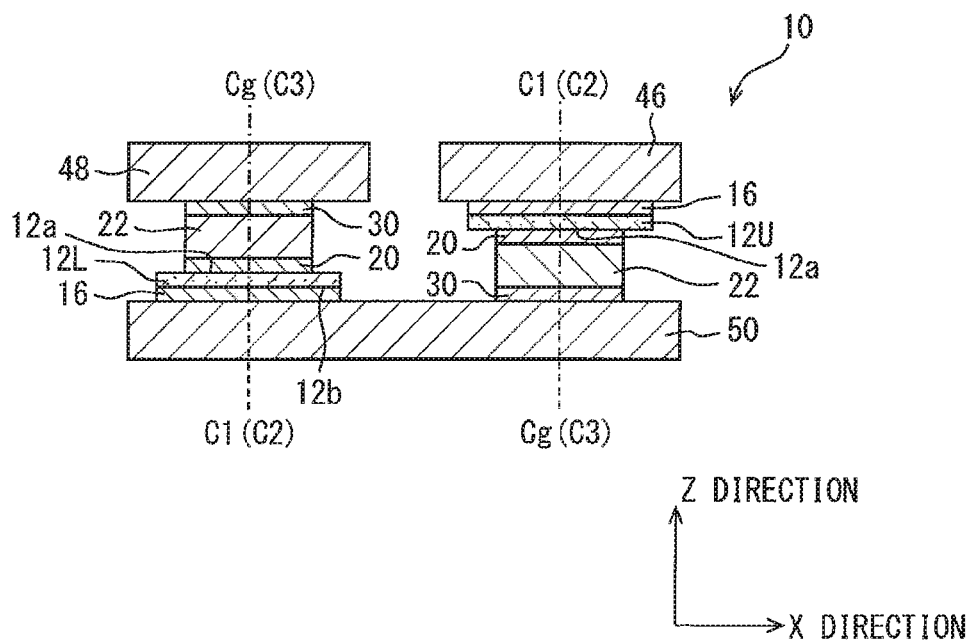
FIG. 31 is a sectional view illustrating a schematic configuration of the semiconductor device according to the eighth embodiment.

Further, the present embodiment differs from the first embodiment in that a semiconductor device 10 includes two semiconductor elements 12 (IGBTs) connected in series, that is, a pair of upper and lower arms. Specifically, as illustrated in FIG. 31, the semiconductor device 10 includes a high potential power terminal 46 (so-called P terminal) which is connected to a high potential side of a DC power supply, a low potential power terminal 48 (so-called N terminal) which is connected to a low potential side of the DC power supply, and an output terminal 50 (so-called O terminal). Further, the semiconductor device 10 includes an upper arm side semiconductor element 12U and a lower arm side semiconductor element 12L as the semiconductor elements 12. In FIG. 31, the sealing resin body 34 is omitted for the sake of convenience.

The upper arm side semiconductor element 12U is disposed between the high potential power terminal 46 and the output terminal 50 with a collector electrode facing the high potential power terminal 46. The collector electrode of the semiconductor element 12U is connected to the high potential power terminal 46 through a solder 16. An emitter electrode 36 of the semiconductor element 12U is electrically connected to the output terminal 50 through a solder 20, a terminal 22, and a solder 30. On the other hand, the lower arm side semiconductor element 12L is disposed between the low potential power terminal 48 and the output terminal 50 with a collector electrode facing the output terminal 50. The collector electrode of the semiconductor element 12L is connected to the output terminal 50 through a solder 16. An emitter electrode 36 of the semiconductor element 12L is electrically connected to the low potential power terminal 48 through a solder 20, a terminal 22, and a solder 30.

In this manner, the output terminal 50 is common between the semiconductor elements 12U, 12L, and the semiconductor element 12U is disposed upside down in the Z direction with respect to the semiconductor element 12L. The semiconductor element 12U is disposed with a first face 12a facing the output terminal 50. The semiconductor element 12L is disposed with a rear face 12b facing the output terminal 50. In this manner, the semiconductor device 10 is a so-called U-shaped 2-in-1 package.

For the semiconductor element 12U, the terminal 22 corresponds to the first metal member, the high potential power terminal 46 corresponds to the second metal member, and the output terminal 50 corresponds to the third metal member. For the semiconductor element 12L, the terminal 22 corresponds to the first metal member, the output terminal 50 corresponds to the second metal member, and the low potential power terminal 48 corresponds to the third metal member. Each of the semiconductor elements 12U, 12L has the structure illustrated in FIG. 30.

Next, an effect of the semiconductor device 10 according to the present embodiment will be described.

Figure 32:
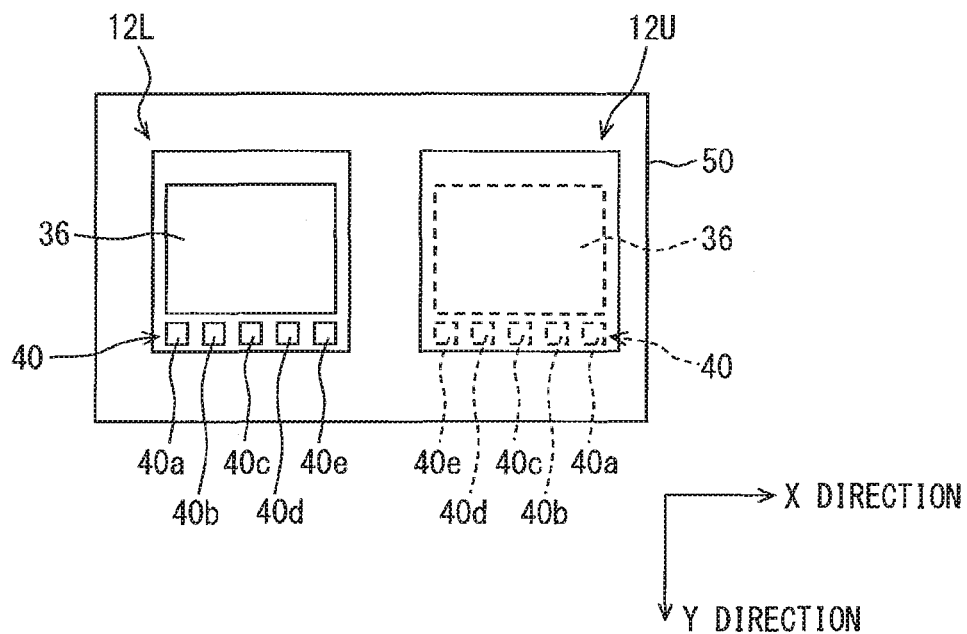
FIG. 32 is a diagram illustrating an arrangement of control pads when two semiconductor elements of the seventh embodiment are used.

When the control pads 40 are formed only in one of the non-solder regions 12a2 and the semiconductor element 12U is disposed upside down with respect to the semiconductor element 12L to employ the U-shaped 2-in-1 package structure, the order of the control pads 40 is opposite between the semiconductor elements 12U, 12L as illustrated in FIG. 32. In FIG. 32, the high potential power terminal 46 and the low potential power terminal 48 are omitted.

Figure 33:
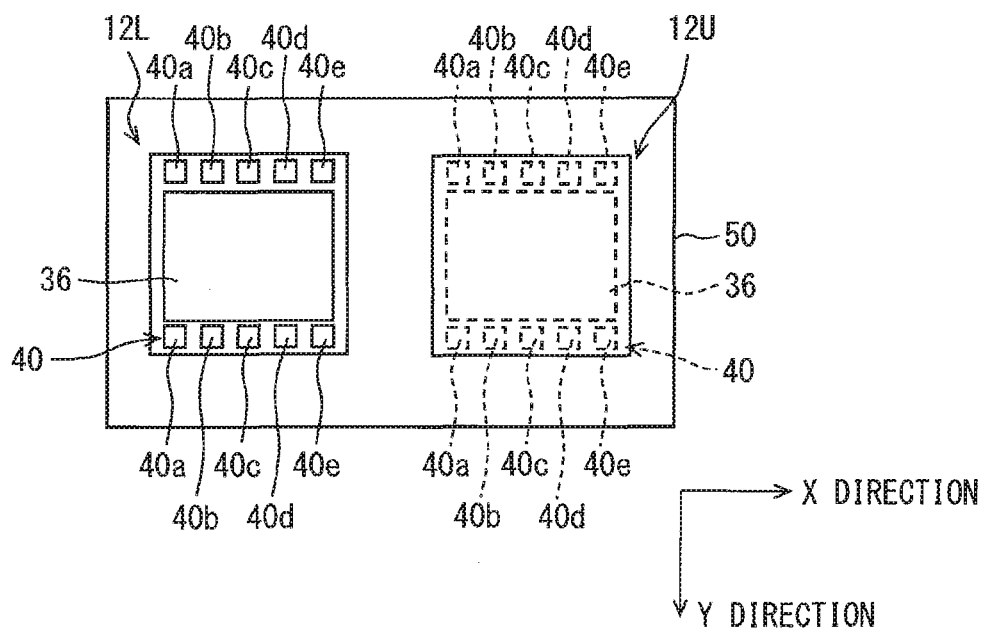
FIG. 33 is a diagram illustrating an arrangement of control pads when two semiconductor elements of the eighth embodiment are used.

On the other hand, in the present embodiment, the control pads 40 are disposed in the non-solder regions 12a2 on both sides in the same order as illustrated in FIG. 31. Thus, when the U-shaped 2-in-1 package structure is employed, the semiconductor elements 12U is disposed upside down with respect to the semiconductor elements 12L, and one of the semiconductor elements 12U, 12L is turned by 180° with respect to the other. Accordingly, as illustrated in FIG. 33, the order of the control pads 40 is the same between the upper arm side semiconductor element 12U and the lower arm side semiconductor element 12L. Thus, the connection structure between an external device and the control terminals 28 (the control pads 40) can be simplified. Also in FIG. 33, the high potential power terminal 46 and the low potential power terminal 48 are omitted.

The preferred embodiments of the present disclosure have been described above. However, the present disclosure is not limited at all to the above embodiments. Various modifications may be made without departing from the gist of the present disclosure.

In the embodiments, there has been described an example in which the semiconductor device 10 includes the terminal 22. However, a configuration that includes no terminal 22 may be employed. For example, when the configuration that includes no terminal 22 is employed in the first embodiment, the second heat sink 32 is connected to the semiconductor element 12 through the solder 20. That is, the second heat sink 32 corresponds to the first metal member.

In the embodiments, there has been described an example in which the semiconductor device 10 includes the second heat sink 32. However, a configuration that includes no second heat sink 32 may be employed. For example, in the first embodiment, a configuration that includes no second heat sink 32 and no solder 30 may be employed.

In the embodiments, examples of the 1-in-1 package and the U-shaped 2-in-1 package have been described as the semiconductor device 10. However, the present disclosure may also be applied to other configurations, for example, an N-shaped 2-in-1 package and a 6-in-1 package.

The N-shaped 2-in-1 package also has a pair of upper and lower arms. The placement of the upper arm side semiconductor element 12U and the placement of the lower arm side semiconductor element 12L are the same in the Z direction. Separate output terminals 50 are provided for the respective semiconductor elements 12U, 12L. One of the output terminals 50 is disposed on a first face 34a of a sealing resin body 34, and the other output terminal 50 is disposed on a rear face 34b of the sealing resin body 34. The output terminals 50 are electrically connected to each other through a joint section. Either a high potential power terminal 46 or a low potential power terminal 48 is disposed on the first face 34a, and the other one is disposed on the rear face 34b. In this manner, in the N-shaped 2-in-1 package, the structure for electrically connecting the high potential power terminal 46, the output terminals 50, and the low potential power terminal 48 has an N shape. The 6-in-1 package includes three pairs of upper and lower arms. That is, the 6-in-1 package has semiconductor elements 12 for three phases.

In the present embodiment, there has been described an example in which the configuration that brings the gravity center position Cg of the terminal 22 into coincidence with the center position Cl of the semiconductor element 12 in the projection view from the Z direction is applied to the semiconductor device 10 that is formed by reflowing both the solders 16, 20 with the semiconductor element 12 stacked on the first heat sink 18 with the solder 16 interposed therebetween and the terminal 22 stacked on the semiconductor element 12 with the solder 20 interposed therebetween. However, the above configuration may be applied to a semiconductor device 10 formed by a method other than reflow. When the second solder is molten in the stacked state, the semiconductor element may be tilted. Thus, the above configuration may be applied to a semiconductor device 10 in which at least the solder 16, among the solders 16, 20, provides melt-joining in the stacked state.

For example, the above configuration may be applied to a semiconductor device 10 that is manufactured in such a manner that a semiconductor element 12 is stacked on a first heat sink 18 with a molten solder 16 interposed therebetween, a terminal 22 is stacked on the semiconductor element 12 with a molten solder 20 interposed therebetween, and both the molten solders 16, 20 are cooled and solidified in the stacked state. Also in such a semiconductor device 10, both the solders 16, 20 are molten in the stacked state. Thus, it is possible to reduce the occurrence of the tilt of the semiconductor element 12 by bringing the gravity center position Cg of the terminal 22 into coincidence with the center position C1 of the semiconductor element 12 in the projection view from the Z direction.

Further, the above configuration may be applied to a semiconductor device 10 that is manufactured in such a manner that a semiconductor element 12 and a terminal 22 are previously joined together with a solder 20, the semiconductor element 12 with the terminal 22 joined thereto is then stacked on a first heat sink 18 with a molten solder 16 interposed therebetween, and the molten solder 16 is cooled and solidified in the stacked state. That is, the above configuration may also be applied to a semiconductor device 10 in which only the solder 16, among the solders 16, 20, provides melt-joining in the stacked state. Also in this case, it is possible to reduce the occurrence of the tilt of the semiconductor element 12 by bringing the gravity center position Cg of the terminal 22 into coincidence with the center position C1 of the semiconductor element 12 in the projection view from the Z direction.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a semiconductor element having a first face and a rear face opposite to the first face, the first face including a solder region for soldering and a non-solder region not for soldering, the rear face being for soldering;
a first metal member disposed on the first face of the semiconductor element;
a second metal member disposed on the rear face of the semiconductor element;
a first solder that connects the solder region of the semiconductor element and the first metal member; and
a second solder that connects the rear face of the semiconductor element and the second metal member, wherein:
at least the second solder provides a melt-bond in the semiconductor device, in which the semiconductor element is stacked on the second metal member through the second solder, and the first metal member is stacked on the semiconductor element through the first solder; and
a gravity center position of the first metal member coincides with a center position of the semiconductor element in a projection view from a stacking direction.

2. The semiconductor device according to claim 1, wherein:
the first metal member has a weight deviation within a plane perpendicular to the stacking direction.

3. The semiconductor device according to claim 2, wherein:
the first metal member has a partially different thickness.

4. The semiconductor device according to claim 3, wherein:
the first metal member includes a cut portion arranged on a surface of the first metal member opposite to a facing surface facing the semiconductor element.

5. The semiconductor device according to claim 4, further comprising:
a third metal member disposed at a side of the first metal member opposite to the semiconductor element; and
a third solder that connects the first metal member and the third metal member.

6. The semiconductor device according to claim 3, wherein:
the first metal member includes a projection arranged on a side of the first metal member adjacent to a facing surface facing the semiconductor element.

7. The semiconductor device according to claim 3, wherein:
the first metal member includes a cavity opening on a side of the first metal member adjacent to a facing surface facing the semiconductor element.

8. The semiconductor device according to claim 2, wherein:
the first metal member has a density of material constituting the first metal member, which is partially different within the plane perpendicular to the stacking direction.

9. The semiconductor device according to claim 1, wherein:
the solder region and the non-solder region of the semiconductor element are arranged that a center position of the solder region coincides with the center position of the first face within the plane perpendicular to the stacking direction.

10. The semiconductor device according to claim 9, wherein:
a part of the non-solder region is located on one end side of the solder region, and at least a portion of a remaining part of the non-solder region is located on another end side of the solder region in a first direction perpendicular to the stacking direction;
the semiconductor element includes a plurality of kinds of external connection pads in the one end side of the non-solder region, and includes same kinds and same number of external connection pads, as the external connection pads in the one end side of the non-solder region, in the another end side of the non-solder region; and
the plurality of kinds of external connection pads in the one end side of the non-solder region are arranged in a predetermined order along a second direction perpendicular to the first direction, and the external connection pads in the another end side of the non-solder region are arranged in a same order as the external connection pads in the one end side of the non-solder region along the second direction.

11. The semiconductor device according to claim 1, wherein:
the gravity center position of the first metal member and the center position of the semiconductor element are located on a straight line parallel to the stacking direction.

12. The semiconductor device according to claim 1, wherein:
the first solder provides a melt-bond; and
the melt-bond of the first solder and the melt-bond of the second solder are reflow bonds.

13. A method for manufacturing the semiconductor device according to claim 5, in which the first solder and the second solder provide reflow bonds as the melt-bond, the method for manufacturing the semiconductor device comprising:

preliminary applying the first solder onto the facing surface of the first metal member including the cut portion, the facing surface facing the semiconductor element, and preliminary applying the third solder onto the surface opposite to the facing surface so as to cover the cut portion;

arranging the semiconductor element on the second metal member through the second solder, arranging the first metal member on the semiconductor element through the first solder, reflowing the first solder and the second solder in an arrangement of the semiconductor element and the first metal member, and forming a connection body having the second metal member, the semiconductor element, and the first metal member integrated together; and arranging the connection body on the third metal member through the third solder so as to face the third metal member, and reflowing the third solder while applying pressure from the second metal member.

14. A method for manufacturing the semiconductor device according to claim 5, in which the first solder and the second solder provide reflow bonds as the melt-bond, the method for manufacturing the semiconductor device comprising:

preliminary applying the first solder onto the facing surface of the first metal member including the cut portion, the facing surface facing the semiconductor element;

arranging the semiconductor element on the second metal member through the second solder, arranging the first metal member on the semiconductor element through the first solder, reflowing the first solder and the second solder in an arrangement of the semiconductor element and the first metal member, and forming a connection body having the second metal member, the semiconductor element, and the first metal member integrated together; and arranging the third solder on the third metal member, arranging the connection body on the third metal member so as to face the third solder and the first metal member, and reflowing the third solder in an arrangement of the connection body while applying pressure from the second metal member.

\* \* \* \* \*